United States Patent
Wang et al.

(10) Patent No.: US 9,728,557 B2
(45) Date of Patent: Aug. 8, 2017

(54) TFT ARRAY SUBSTRATE, DISPLAY PANEL AND DISPLAY DEVICE

(71) Applicants: Shanghai AVIC Optoelectronics Co., Ltd., Shanghai (CN); Tianma Micro-Electronics Co., Ltd., Shenzhen (CN)

(72) Inventors: Tinghai Wang, Shanghai (CN); Zhaokeng Cao, Shanghai (CN)

(73) Assignees: Shanghai AVIC Optoelectronics Co., Ltd., Shanghai (CN); Tianma Microelectronics Co., Ltd., Shenzhen (CN)

( * ) Notice: Subject to any disclaimer, the term of this patent is extended or adjusted under 35 U.S.C. 154(b) by 0 days.

(21) Appl. No.: 14/226,775

(22) Filed: Mar. 26, 2014

(65) Prior Publication Data

US 2015/0102353 A1 Apr. 16, 2015

(30) Foreign Application Priority Data

Oct. 10, 2013 (CN) .......................... 2013 1 0470077

(51) Int. Cl.
*H01L 27/12* (2006.01)
(52) U.S. Cl.
CPC ........ *H01L 27/124* (2013.01); *H01L 27/1248* (2013.01)

(58) Field of Classification Search
CPC ............. H01L 27/1214; H01L 27/1237; H01L 27/124; H01L 27/1244; H01L 27/1248
See application file for complete search history.

(56) References Cited

U.S. PATENT DOCUMENTS

| 6,091,473 A * | 7/2000 | Hebiguchi ........ G02F 1/134363 349/138 |
| 7,161,226 B2 * | 1/2007 | Chen ................. G02F 1/136286 257/522 |
| 7,227,181 B2 * | 6/2007 | Hwang ............... H01L 27/3276 257/40 |
| 9,104,081 B2 * | 8/2015 | Ahn .................. G02F 1/133345 |
| 2005/0078260 A1 * | 4/2005 | Ono et al. ..................... 349/141 |
| 2013/0087797 A1 * | 4/2013 | Kwack et al. .................. 257/59 |

FOREIGN PATENT DOCUMENTS

| CN | 101123257 A | 2/2008 |
| CN | 101359670 A | 2/2009 |
| CN | 103064224 A | 4/2013 |
| TW | 200416465 A | 9/2004 |

* cited by examiner

*Primary Examiner* — Karen Kusumakar
(74) *Attorney, Agent, or Firm* — Alston & Bird LLP

(57) ABSTRACT

A TFT array substrate is disclosed. The TFT array substrate includes a substrate, a data line disposed above the substrate, and a gate insulating layer disposed above the substrate, where the gate insulating layer includes a groove. The TFT array substrate also includes a data line disposed within the groove of the gate insulating layer.

18 Claims, 7 Drawing Sheets the TFT array substrate according to a second embodiment of the present invention;
TFT ARRAY SUBSTRATE, DISPLAY PANEL AND DISPLAY DEVICE

CROSS REFERENCE TO RELATED APPLICATIONS

This application claims the benefit of priority to Chinese Patent Application No. 201310470077.0, filed with the Chinese Patent Office on Oct. 10, 2013 and entitled "TFT ARRAY SUBSTRATE, DISPLAY PANEL AND DISPLAY DEVICE", the content of which is incorporated herein by reference in its entirety.

TECHNICAL FIELD

The present invention relates to the field of display technologies, and more particularly, to a Thin Film Transistor (TFT) array substrate, a display panel, and a display device.

BACKGROUND OF THE INVENTION

So far, flat panel displays such as Liquid Crystal Displays (LCDs) and Organic Light Emitting Diode (OLED) displays are popular in the present display market due to their advantages like a small volume, a light weight, a less thickness, low power consumption, low radiation. To meet the increasingly demanding requirements for the display resolution and the display effect of the flat panel display, it's necessary for those skilled in the art to reduce the coupling capacitance between the common electrode and data lines, and hence to reduce the flicker and improve the display effect of the display.

BRIEF SUMMARY OF THE INVENTION

One inventive aspect is a TFT array substrate. The TFT array substrate includes a substrate, a data line disposed above the substrate, and a gate insulating layer disposed above the substrate, where the gate insulating layer includes a groove, and the data line is disposed within the groove of the gate insulating layer.

Another inventive aspect is a display panel. The display panel includes a TFT array substrate, and the TFT substrate includes a gate insulating layer with a groove. The TFT substrate also includes a data line disposed within the groove of the gate insulating layer. The display panel also includes a color filter substrate, which is disposed opposite to the TFT array substrate.

Another inventive aspect is a display device. The display device includes a TFT array substrate, and the TFT substrate includes a gate insulating layer with a groove. The TFT array substrate also includes a data line disposed within the groove of the gate insulating layer.

DETAILED DESCRIPTION OF THE PREFERRED EMBODIMENTS

For the sake of better understanding on the above objects, features and advantages of the present invention, the present invention will be described in detail below in combination with accompanying drawings and embodiments of the present invention.

Numerous specific details are set forth in the following description in order to fully understand the present invention. However, the present invention can also be implemented in other ways different from those described herein. Similar variants may be derived by those skilled in the art without departing from the essence of the invention. Therefore, the present invention is not limited to the following specific embodiments as disclosed.

Figure 1:
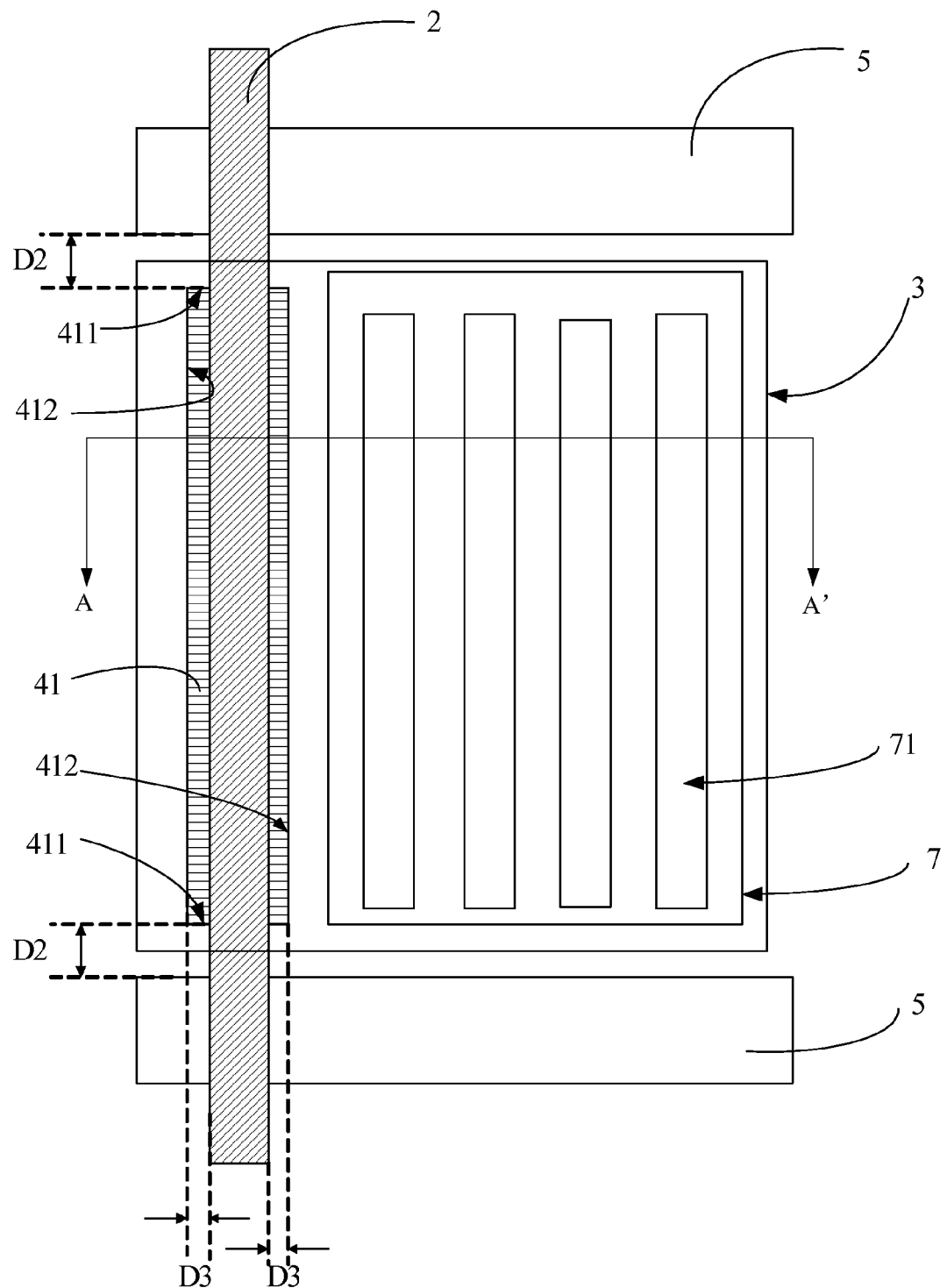
FIG. 1 is a schematic diagram showing the partial structure of a first example of a TFT array substrate according to a first embodiment of the present invention.
Figure 2:
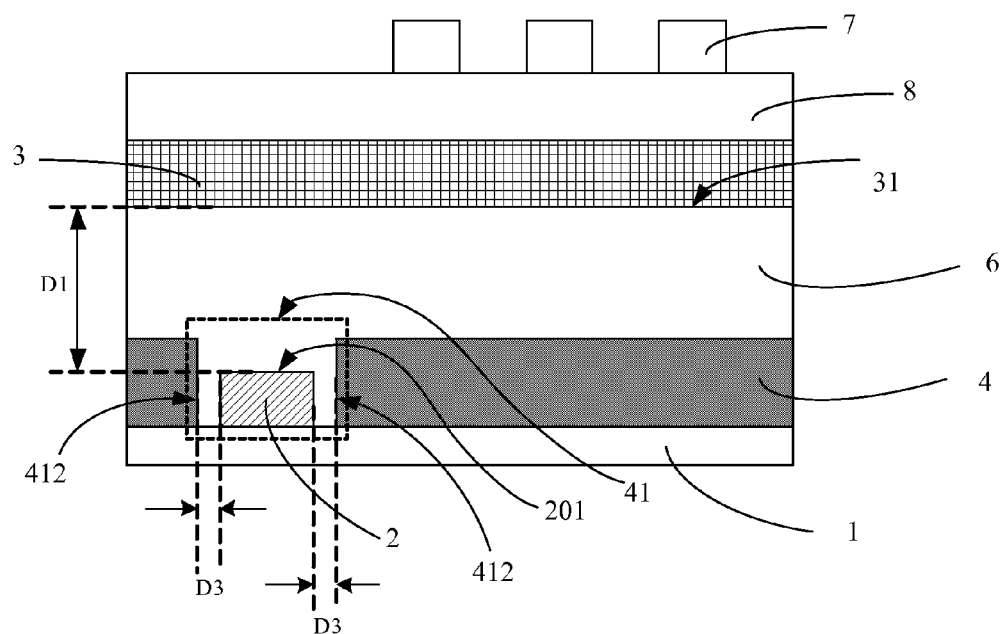
FIG. 2 is a schematic diagram showing a first example of a cross-section, taken along a line AA' in FIG. 1, of the TFT array substrate according to the first embodiment of the present invention.
Figure 3:
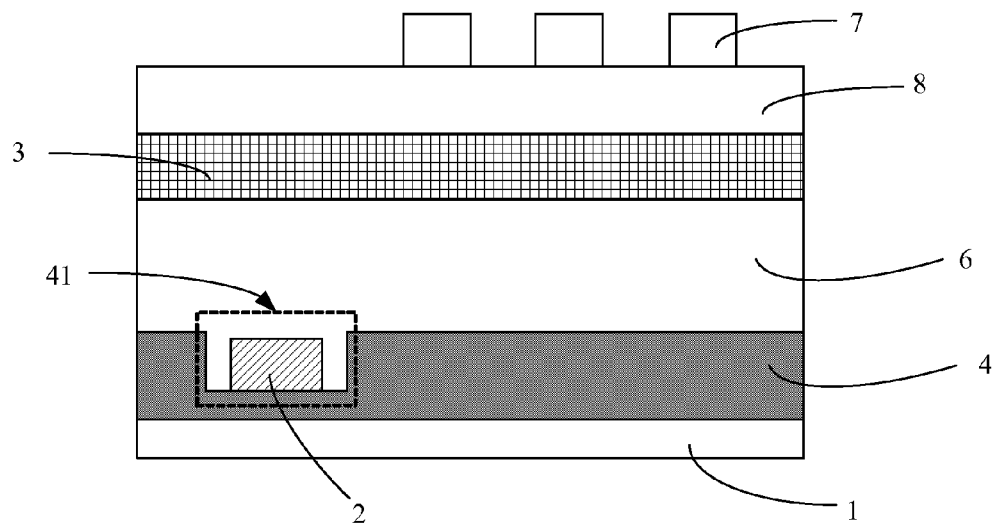
FIG. 3 is a schematic diagram showing a second example of the cross-section, taken along a line AA' in FIG. 1, of the TFT array substrate according to the first embodiment of the present invention.
Figure 4:
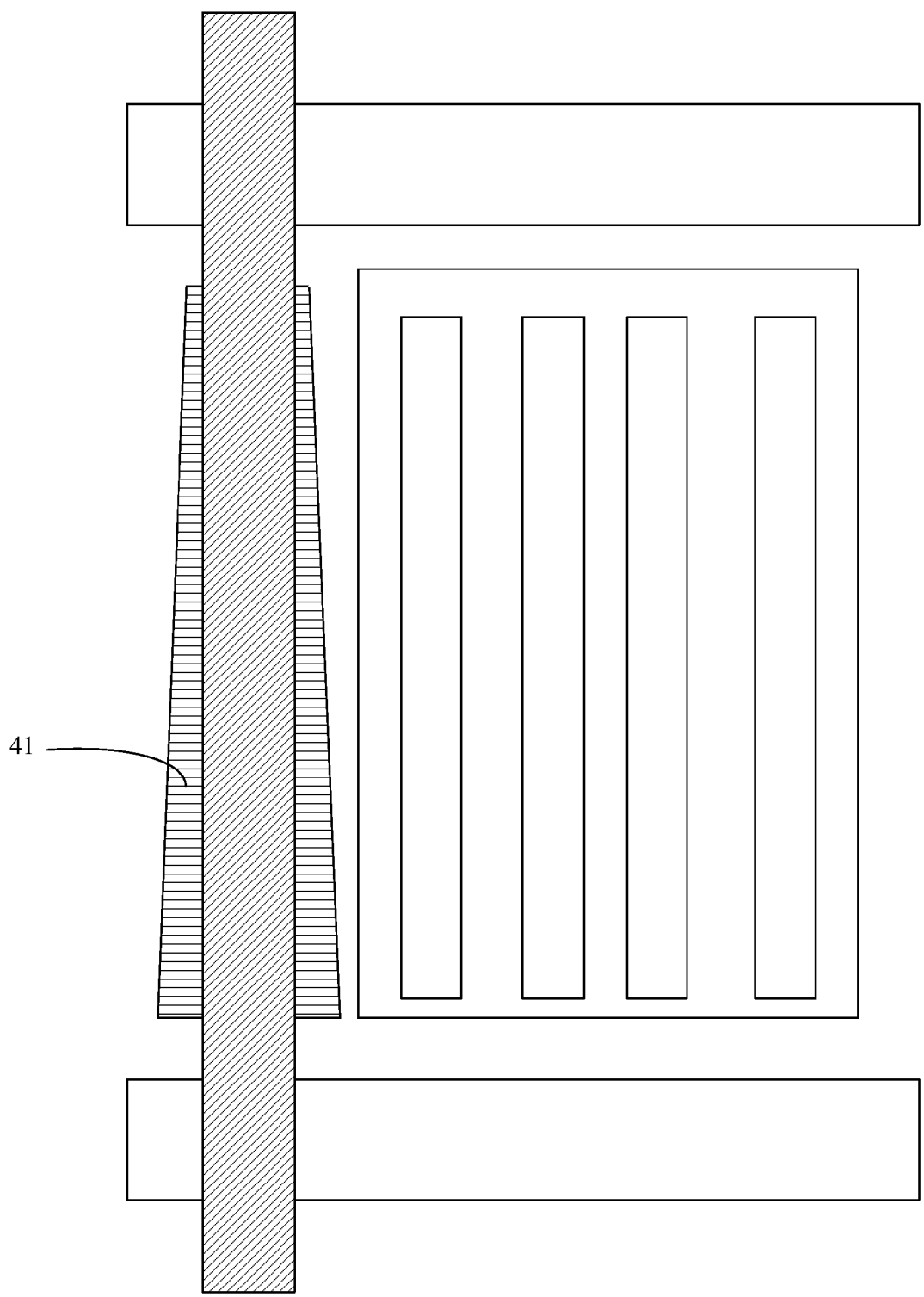
FIG. 4 is a schematic diagram showing the partial structure of a second example of a TFT array substrate according to a first embodiment of the present invention.

One embodiment of the invention (first embodiment of the invention) provides a TFT array substrate, the structure of which is schematically shown in FIG. 1. FIG. 2 is a schematic diagram showing the cross-section of the TFT array substrate taken along a line AA' in FIG. 1. As shown in FIG. 1 and FIG. 2, the TFT array substrate includes: a substrate 1; a data line 2, which is disposed on the substrate 1 and has a first surface 201 on a side away from the substrate 1; a common electrode 3, which is disposed above the substrate 1 and the data line 2, and the common electrode 3 has a second surface 31 on a side proximal to the substrate 1; a gate insulating layer 4; a gate line 5; a dielectric layer 6; a pixel electrode 7; and a passivation layer 8. The gate insulating layer 4 is disposed between the substrate 1 and the common electrode 3, and the gate line 5 is disposed between the substrate 1 and the gate insulating layer 4. As shown in FIG. 1, the gate line 5 intersects insulatedly with the data line 2, to form a pixel unit (not shown). As shown in FIG. 2, the dielectric layer 6 extends over the entire substrate 1 and is disposed on the data line 2, and the dielectric layer 6 covers the data line 2 and the gate insulating layer 4. Here, the gate insulating layer 4 includes a groove 41 which does not intersect with the gate line 5 in a same plane, and the data line 2 is disposed within the groove 41. The first surface 201 of the data line 2 is spaced from the second surface 31 of the common electrode 3 by a distance D1 greater than 1.5 µm. The groove 41 includes two end sides 411 extending across the data line 2, and each of the end sides 411 is spaced from the adjacent gate line 5 by a distance D2 greater than 4 µm. The groove 41 includes two lateral sides 412 extending lengthwise next to the data line 2 on opposite sides, and each of the lateral sides 412 is spaced from the data line 2 by a distance D3 greater than 2 µm. In the present embodiment, the groove 41 extends through the gate insulating layer 4 to expose the substrate 1. In other embodiments, however, the groove 41 may not extend through the gate insulating layer 4 and the groove 41 opens towards its side away from the substrate 1, as shown in FIG. 3. It shall be noted that, in the present embodiment, the shape of the groove 41 is a rectangle in a plane view, while the shape of the groove 41 in a plane view is merely illustrative instead of limiting in the present embodiment. Moreover, the shape of the groove 41 is not limited to a rectangle in a plane view, but may be a trapezoid (as shown in FIG. 4), a parallelogram, etc., as long as the groove 41 satisfies the following conditions: 1) the groove 41 does not intersect with the gate line 5 in the same plane; 2) the groove 41 includes two end sides 411 extending along the data line 2, and each of the end sides 411 is spaced from the adjacent gate line 5 by a distance D2 greater than 4 µm; and 3) the groove 41 includes two lateral sides 412 extending along the gate line 5, and each of the lateral sides 412 is spaced from the data line 2 by a distance D3 greater than 2 µm. Thus in practice, those skilled in the art is allowed to properly select a suitable planar shape of the groove 41 as desired. In addition, there is only one groove 41 in the present embodiment, which is illustrative but not limiting, and there may be two or more grooves 41 (which are not shown), thus the number of the grooves 41 is not limited in the present embodiment of the invention.

Figure 5:
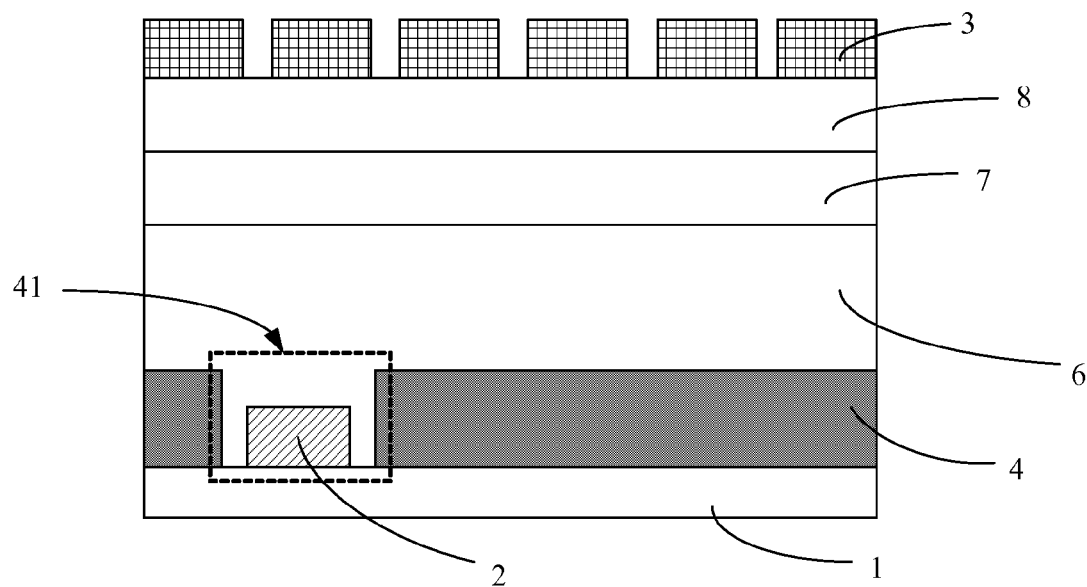
FIG. 5 is a schematic diagram showing a third example of the cross-section, taken along a line AA' in FIG. 1, of the TFT array substrate according to the first embodiment of the present invention.
Figure 6:
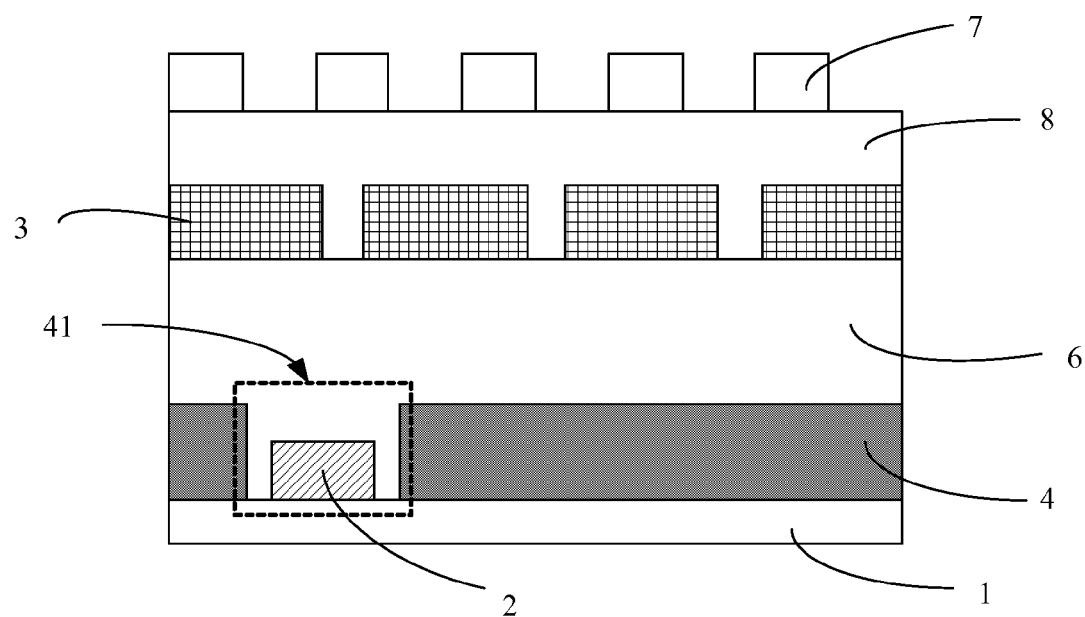
FIG. 6 is a schematic diagram showing a fourth example of the cross-section, taken along a line AA' in FIG. 1, of the TFT array substrate according to the first embodiment of the present invention.

Referring to FIG. 2, the pixel electrode 7 is disposed above the common electrode in the present embodiment, and the passivation layer 8 is disposed between the pixel electrode 7 and the common electrode 3. The pixel electrode 7 includes at least one slit 71, thus the pixel electrode 7 is in a shape of comb-teeth, and the common electrode 3 extends over the entire substrate 1, namely the common electrode 3 does not include slit(s) 71. In other embodiments, a shown in FIG. 5, the pixel electrode 7 may be disposed below the common electrode 3. Further, in other embodiments, both of the pixel electrode 7 and the common electrode 3 may include at least one slit and thus both of the pixel electrode 7 and the common electrode 3 are in a shape of comb-teeth (as shown in FIG. 6), or in another embodiment, the pixel electrode 7 extends over the entire substrate 1, namely the pixel electrode 7 does not include slit(s), while ti common electrode 3 is in a shape of comb-teeth (as shown in FIG. 5).

In the TFT array substrate of the present embodiment, the gate line 5 and the data line 2 each may be made of a material depending on the employed structure and techniques. Generally, each of the gate line 5 and the data line 2 may be formed in a single layer structure made of a metal such as Mo, Cr, W, Ti, Ta, Mo, Al or Cu, or be formed in a composite structure made of two or more of metals such as Cr, W, Ti, Ta, Mo, Al and Cu, and each of the gate line 5 and the data line 2 may has a typical thickness from 0.2 µm to 0.35 µm. The common electrode 3 and the pixel electrode 7 may be made of a transparent material such as Indium Tin Oxide, Aluminum Zinc Oxide, Indium Zinc Oxide, Indium Oxide, Indium Gallium Oxide, or Zinc Oxide. The gate insulating layer 4 has a thickness from 0.3 µm to 0.4 µm.

In the TFT array substrate of the present embodiment, the groove 41 is disposed in the gate insulating layer 4 to receive the data line 2 (namely, the data line 2 is disposed within the groove of the gate insulating layer), so that the distance D1 between the first surface 201 of the data line 2 and the second surface 31 of the common electrode 3 is increased, and the distance D1 between the first surface 201 of the data line 2 and the second surface 31 of the common electrode 3 may vary with the height H of the groove 41. That is, if the height H of the groove 41 is increased, the distance D1 between the first surface 201 of the data line 2 and the second surface 31 of the common electrode 3 is increased, so that the capacitance C between the data line 2 and the common electrode 3 is reduced; otherwise, if the height H of the groove 41 is decreased, the distance D1 between the first surface 201 of the data line 2 and the second surface 31 of the common electrode 3 is decreased, so that the capacitance C between the data line 2 and the common electrode 3 is increased. Considering the capacitance calculation formula of $C=(\in * \in_0 * S)/D1$, where $\in$ and $\in_0$ denote dielectric constants which are well known in the art and thus are not further described herein, S denotes an area of the overlapped portion between the common electrode 3 and the data line 2, and D1 denotes the distance between the first surface 201 of the data line 2 and the second surface 31 of the common electrode 3, the TFT array substrate is advantageous for at least one of effects as follows: the capacitance (i.e. the coupling capacitance) between the data line 2 and the common electrode 3 is reduced, the electric field interference caused by the data line 2 is reduced because the data line 2 is covered by the common electrode 3 or the dielectric layer 6 and will not interfere the pixel electrode 7, the flicker and crosstalk is reduced, the yield of the TFT substrate is improved, and the display quality is improved; further, the groove 41 will not degrade the evenness of layers in the pixel region (namely the display area) due to the presence of the dielectric layer 6.

The second embodiment of the present invention is derived from the first embodiment, but is different from the first embodiment in that: data line and the gate line are disposed on the same layer, the TFT array substrate further includes a conducting line and connecting via holes, the conducting line is disposed on the gate insulating layer, the connecting via holes extend through the gate insulating layer from top to bottom (toward the substrate), the conducting line insulatedly intersects with the gate line, the conducting line is connected with the data lines through the connecting via holes, and the groove does not extend through the gate insulating layer from top to bottom and opens to the substrate. However, the same parts between the first embodiment and second embodiment will not be described again hereinafter.

Figure 7:
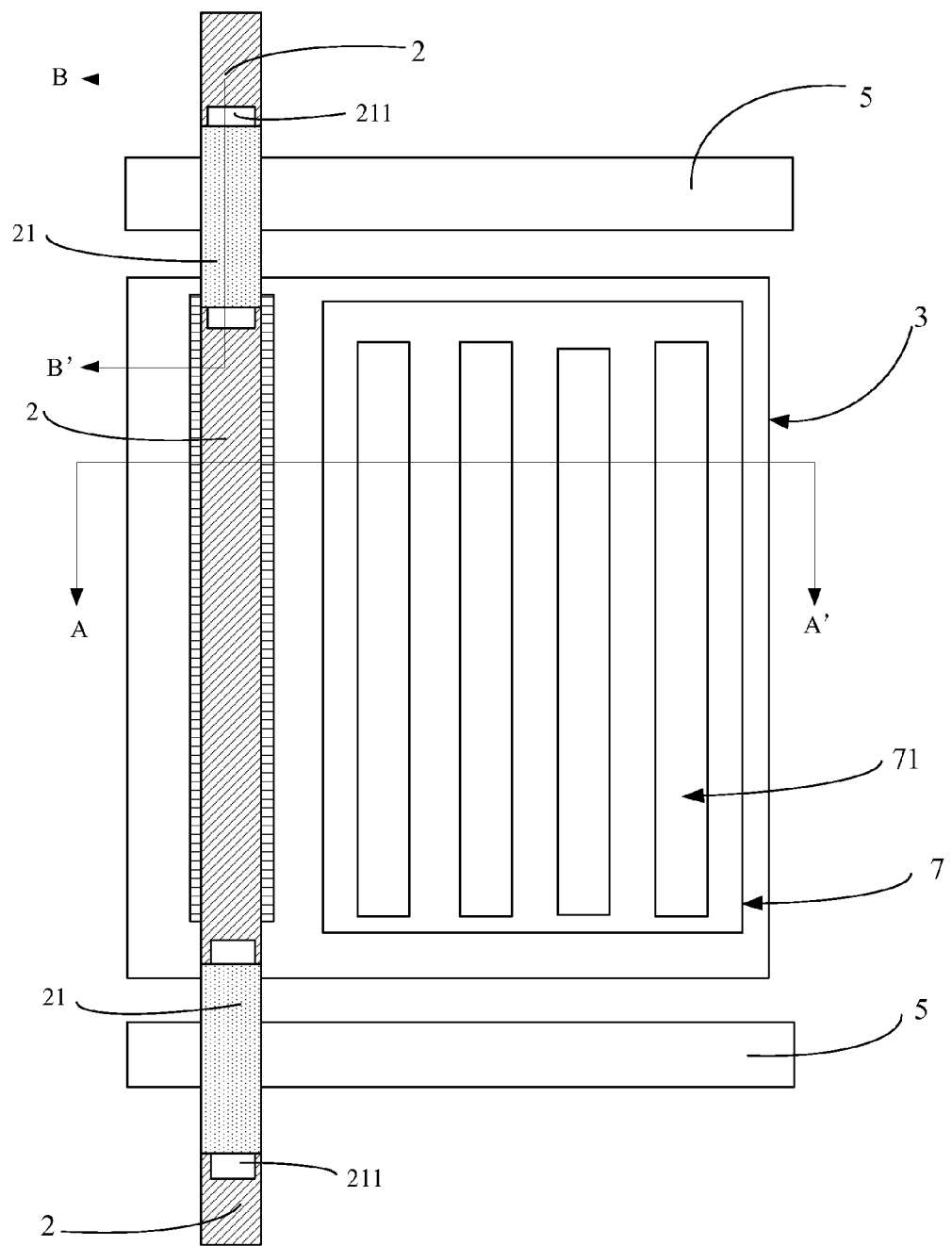
FIG. 7 is a schematic diagram showing a partial structure of the TFT array substrate according to a second embodiment of the present invention.
Figure 8A:
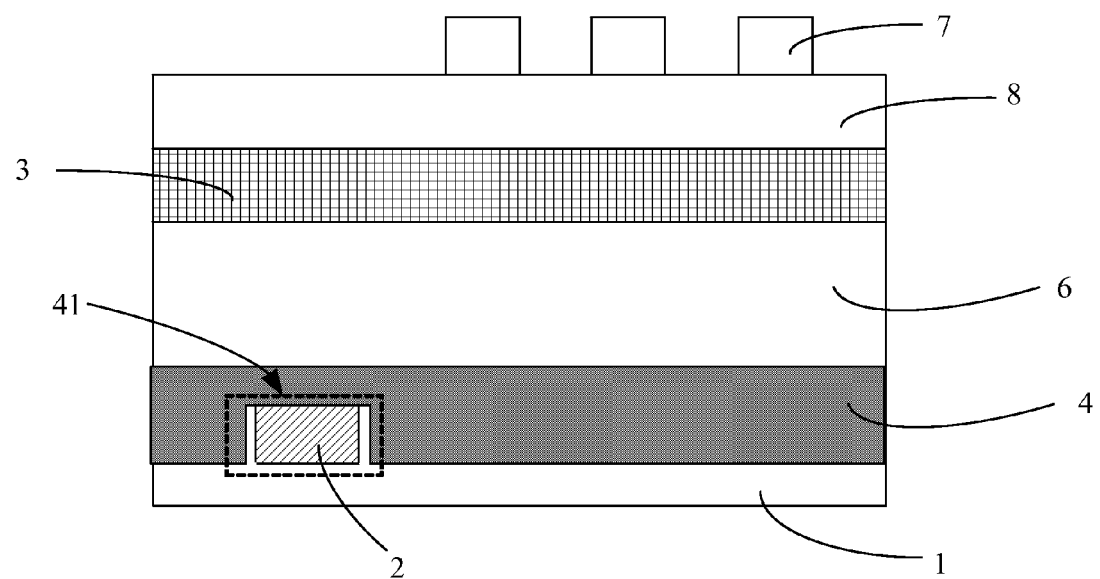
FIG. 8a is a schematic diagram showing a cross-section, taken along a line AA' in FIG. 7, of the TFT array substrate according to the second embodiment of the present invention.
Figure 8B:
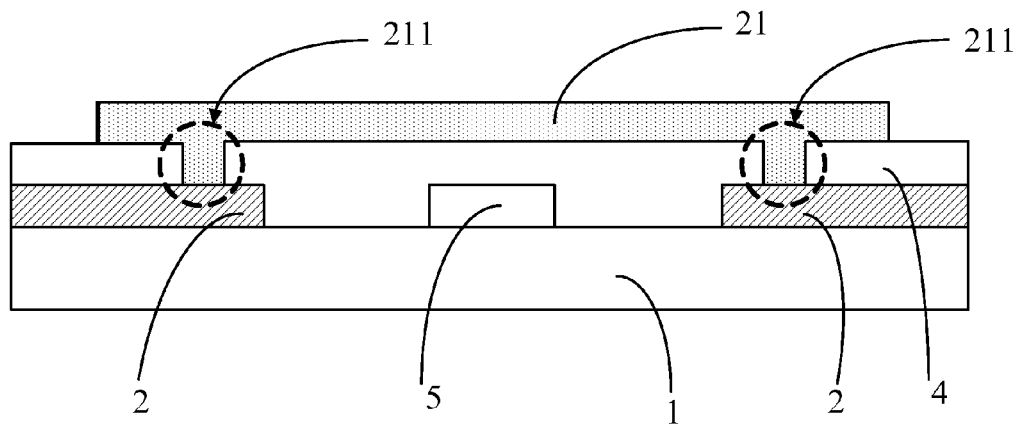
FIG. 8b is a schematic diagram showing a cross-section, taken along a line BB' in FIG. 7, of the TFT array substrate according to the second embodiment of the present invention.

Particularly, as shown in FIG. 7, FIG. 8a and FIG. 8b, data line 2 and the gate line 5 are disposed on the same layer, the TFT array substrate further includes a conducting line 21 and connecting via holes 211, the conducting line 21 is disposed on the gate insulating layer 4, the connecting via holes 211 extend through the gate insulating layer 4 from top to bottom (toward the substrate 1), the conducting line 21 insulatedly intersects with the gate line 5, the conducting line 21 is connected with the data line 2 through the connecting via holes 211, and the groove 41 does not extend through the gate insulating layer 4 from top to bottom and opens to the substrate 1.

Figure 9:
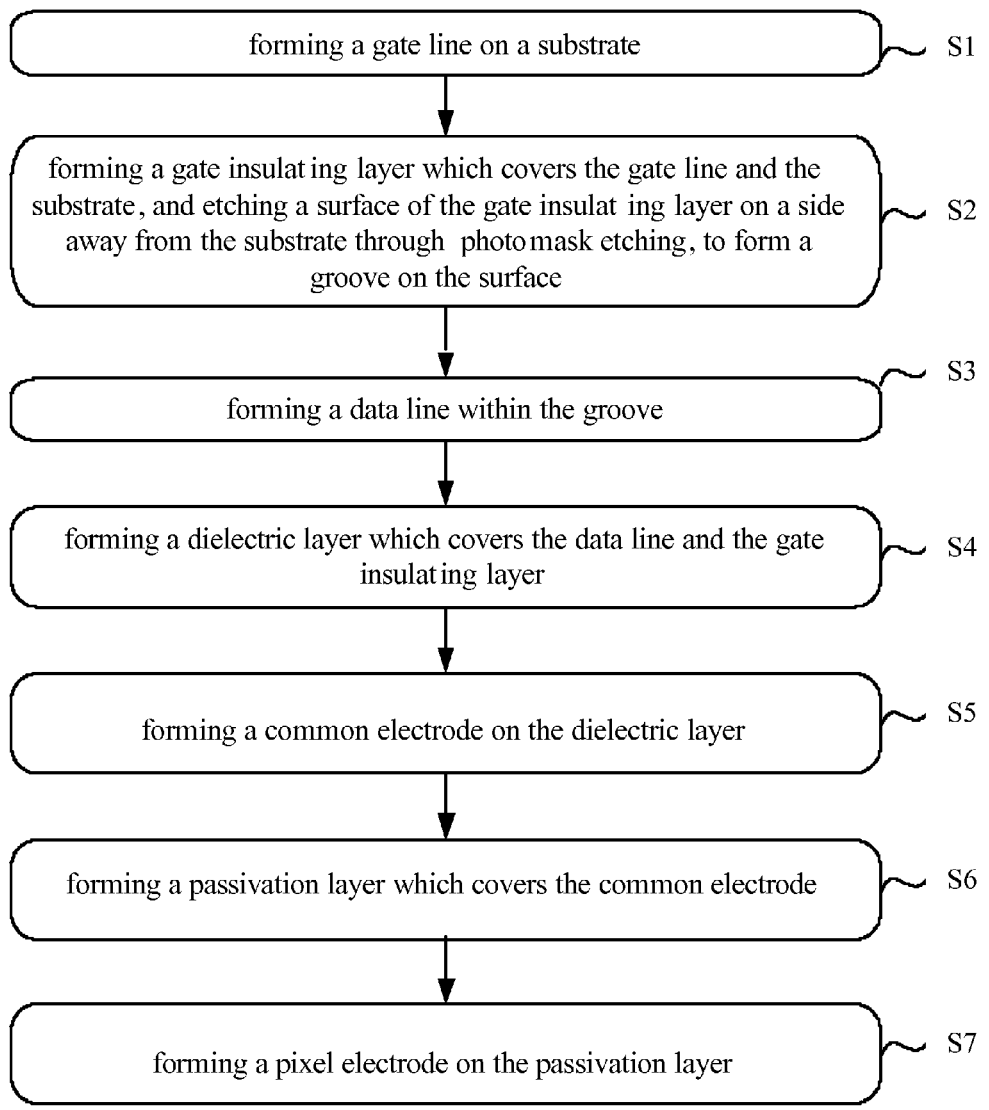
FIG. 9 is a flow chart of a manufacturing method of the TFT array substrate according to the first embodiment of the present invention.

As shown in FIG. 9, the embodiment of the prevent invention further provides a manufacturing method of a TFT array substrate, and the method includes steps of:

S1: forming a gate line on a substrate;

S2: forming a gate insulating layer which covers the gate line and the substrate, where the gate insulating layer includes a groove, for example, the groove may be formed by etching a surface of the gate insulating layer on a side away from the substrate through photomask etching, to form the groove on the surface;

S3 forming a data line within the groove;

S4: forming a dielectric layer which covers the data line and the gate insulating layer;

S5: forming a common electrode on the dielectric layer;

S6: forming a passivation layer which covers the common electrode; and

S7: forming a pixel electrode on the passivation layer.

The data line has a first surface on a side away from the substrate, the common electrode has a second surface on a side proximal to the substrate, and the distance between the first surface of the data line and the second surface of the common electrode is greater than 1.5 µm. The groove includes two end sides extending along the data line, and each of the end sides is spaced from the adjacent gate line by a distance greater than 4 µm. The groove includes two lateral sides extending along the gate line, and each of the lateral sides is spaced from the data line by a distance greater than 2 µm. The groove may extend through the gate insulating layer to expose the substrate, or the groove does not extend through the gate insulating layer. The shape of the groove is not limited to a trapezoid or a parallelogram in a plan view.

Correspondingly, the manufacturing method (not shown) of the TFT array substrate of the second embodiment is mostly the same as the manufacturing method of the TFT array substrate of the first embodiment, but includes the following steps S1', S2' and S3' which take the place of the above-described steps S1, S2 and S3:

S1': forming a gate line and a plurality of disconnected data lines on a substrate, where the gate line and the data lines are disposed in the same layer, and the gate line does not intersect with the data lines;

S2': forming a gate insulating layer which covers the gate line and the entire substrate, where the gate insulating layer includes a groove receiving the data lines (namely, the data line is disposed within the groove of the gate insulating layer), and S3': forming a conducting line and connecting via holes, where the conducting line is disposed on the gate insulating layer and insulatedly intersects with the gate line, the connecting via holes extend through the gate insulating layer, and the conducting line is connected with the data lines through the connecting via holes.

The embodiment of the present invention further provides a display panel (not shown), which includes: a TFT array substrate, and a color filter substrate (not shown) disposed opposite to the TFT array substrate. The TFT array substrate may employ the TFT array substrate of the above-mentioned embodiments, and the display panel is generally, but not limited to a liquid crystal display panel.

The embodiment of the present invention further provides a display device (not shown) including a TFT array substrate, where the TFT array substrate may employ the TFT array substrate of the above-mentioned embodiments, and the display device is generally, but not limited to a liquid crystal display device, and may be alternatively an OLED display device.

It is noted that: 1) the TFT array substrate may be manufactured by an amorphous silicon-based process, a low-temperature polycrystalline silicon-based process, or an oxide-based process, which are well known in the art and are not described again; and 2) the photomask etch technology employed in the embodiments of the invention includes processes such as photoresist coating, image exposure using a mask, image development, etching, photoresist removal, and so on, which are known in the art, and the photoresist may be a positive or negative photoresist.

As such, with the TFT array substrate, the manufacturing method of the TFT array substrate, the display panel, and the display device disclosed in embodiments of the invention, the groove is formed (disposed) in the gate insulating layer to receive the data line (namely, the data line is disposed within the groove of the gate insulating layer), so that the distance between the first surface of the data line and the second surface of the common electrode is greater than 1.5 µm, to achieve at least one of effects as follows: the capacitance (i.e. the coupling capacitance) between the data line and the common electrode is reduced, the electric field interference caused by the data line is reduced because the data line is covered by the common electrode or the dielectric layer and will not interfere the pixel electrode, the flicker and crosstalk is reduced, the yield of the TFT substrate is improved, and the display quality is improved; further, the groove will not degrade the evenness of layers in the pixel region (namely the display area) due to the presence of the dielectric layer.

Modifications and variations can be made to the invention by those skilled in the art in light of the above disclosed methods and techniques without departing from the concept and the scope of the present invention. Accordingly, all these modifications and variations, if not departing from the contents of the technical solutions of the present invention, should fall into the scope of the present invention.

What is claimed is:

1. A TFT array substrate, comprising:
   a substrate;
   a plurality of gate lines formed on the substrate;
   a gate insulating layer disposed on the plurality of gate lines;
   a plurality of grooves formed in the gate insulating layer;
   a plurality of data lines each disposed inside one of the plurality of grooves, wherein the data lines are insulated from the said gate lines, wherein a projection of the data lines and a projection of the gate lines onto the substrate intersect with each other, and the data lines and the gate lines define an array of pixel units;
   a dielectric layer disposed on the gate insulating layer; and
   a common electrode disposed on the dielectric layer;
   wherein the grooves are completely covered by the orthogonal projection of the common electrodes onto the substrate.

2. The TFT array substrate of claim 1, wherein the plurality of grooves are cutting through the gate insulating layer to expose the substrate.

3. The TFT array substrate of claim 1, wherein the plurality of grooves are partially embedded in the gate insulating layer.

4. The TFT array substrate of claim 3, wherein the grooves opens to a side away from the substrate.

5. The TFT array substrate of claim 3, wherein the grooves opens to a side facing the substrate.

6. The TFT array substrate of claim 5, further comprising:
   a conducting line; and
   connecting via holes,
   wherein the conducting line is disposed on the gate insulating layer, the connecting via holes extend through the gate insulating layer toward the substrate, and the conducting line is connected with the data line through the connecting via holes.

7. The TFT array substrate of claim 1, further comprising a gate line between the substrate and the gate insulating layer, wherein the grooves does not intersect with the gate line in a plane view.

8. The TFT array substrate of claim 1, wherein each of the grooves includes two end sides extending across the data line, and each of the end sides is spaced from an adjacent gate line by a distance greater than 4 µm.

9. The TFT array substrate of claim 1, wherein each of the grooves includes two lateral sides extending lengthwise on opposite sides next to a respective data line, and each of the lateral sides is spaced from the data line by a distance greater than 2 µm.

10. The TFT array substrate of claim 1, wherein a cross-sectional shape of the grooves are a trapezoid or a parallelogram.

11. The TFT array substrate of claim 1, wherein the data line has a first surface on a side distal from the substrate, the common electrode has a second surface on a side proximal to the substrate, and a distance between the first surface of the data line and the second surface of the common electrode is greater than 1.5 µm.

12. The TFT array substrate of claim 1, further comprising a pixel electrode disposed below the common electrode.

13. The TFT array substrate of claim 12, wherein at least one of the pixel electrode and the common electrode is in a shape of comb-teeth.

14. The TFT array substrate of claim 1, further comprising a pixel electrode, wherein the pixel electrode is disposed above the common electrode.

15. A display panel, comprising:
a color filter substrate, and
a TFT array substrate disposed opposite to the color filter substrate, the TFT array substrate comprising:
a substrate;
a plurality of gate lines formed on the substrate;
a gate insulating layer disposed on the plurality of gate lines;
a plurality of grooves formed in the gate insulating layer;
a plurality of data lines each disposed inside one of the plurality of grooves, wherein the data lines are insulated from the said gate lines, wherein a projection of the data lines and a projection of the gate lines onto the substrate intersect with each other, and the data lines and the gate lines define an array of pixel units;
a dielectric layer disposed on the gate insulating layer; and
a common electrode layer disposed on the dielectric layer;
wherein the grooves are completely covered by the orthogonal projection of the common electrodes on the substrate.

16. The TFT array substrate of claim 15, further comprising a pixel electrode, wherein the pixel electrode is disposed above the common electrode.

17. A display device, comprising:
a display panel, which comprises,
a TFT array substrate, comprising:
a substrate;
a plurality of gate lines formed on the substrate;
a gate insulating layer disposed on the plurality of gate lines;
a plurality of grooves formed in the gate insulating layer;
a plurality of data lines each disposed inside one of the plurality of grooves, wherein the data lines are insulated from the said gate lines, wherein a projection of the data lines and a projection of the gate lines onto the substrate intersect with each other, and the data lines and the gate lines define an array of pixel units;
a dielectric layer disposed on the gate insulating layer; and
a common electrode layer disposed on the dielectric layer;
wherein the grooves are completely covered by the orthogonal projection of the common electrodes onto the substrate.

18. The TFT array substrate of claim 17, further comprising a pixel electrode, wherein the pixel electrode is disposed above the common electrode.

* * * * *